(12) United States Patent
Savin

(10) Patent No.: US 8,291,284 B2
(45) Date of Patent: Oct. 16, 2012

(54) METHOD AND DEVICE FOR DECODING LDPC CODES AND COMMUNICATION APPARATUS INCLUDING SUCH DEVICE

(75) Inventor: Valentin Savin, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 661 days.

(21) Appl. No.: 12/517,018

(22) PCT Filed: Nov. 29, 2007

(86) PCT No.: PCT/FR2007/001963
§ 371 (c)(1),
(2), (4) Date: May 29, 2009

(87) PCT Pub. No.: WO2008/071884
PCT Pub. Date: Jun. 19, 2008

(65) Prior Publication Data
US 2010/0050043 A1 Feb. 25, 2010

(30) Foreign Application Priority Data
Dec. 1, 2006 (FR) .................................. 06 55275

(51) Int. Cl.
*H03M 13/00* (2006.01)
(52) U.S. Cl. .................... 714/752; 714/746; 714/758
(58) Field of Classification Search .................. 714/746, 714/752, 758
See application file for complete search history.

(56) References Cited

U.S. PATENT DOCUMENTS
2005/0138516 A1 6/2005 Yedidia
2005/0204271 A1* 9/2005 Sharon et al. ................. 714/801
2005/0265387 A1* 12/2005 Khojastepour et al. ....... 370/467
2005/0283707 A1* 12/2005 Sharon et al. ................. 714/758
2007/0083802 A1* 4/2007 Xin et al. ...................... 714/752
2007/0234184 A1* 10/2007 Richardson ................... 714/780

(Continued)

OTHER PUBLICATIONS

R.G. Gallager, "Low-Density Parity-Check Codes", *IRE Transactions on Information Theory*, Jan. 1962, p. 21-28.

(Continued)

*Primary Examiner* — Sam Rizk
(74) *Attorney, Agent, or Firm* — Brinks Hofer Gilson & Lione

(57) ABSTRACT

A device and method for the iterative decoding of a received word represented by signal values according to a parity control matrix code of the type for passing messages between variable nodes and control nodes of a two-part graph related to the matrix. The method includes at least the following steps: setting up at least one message of a variable node, according to the values, by an information representative of the ratio between the probability of having the most likely symbol at a position corresponding to the variable node and the probability of having the current symbol at the position; determining at least one message, relating to a determined symbol, of a control node to a determined variable node, as the selected minimal value, among the symbol sequences corresponding to the control node equation using the determined symbol at the determined variable node, by the maximal value of the messages received at the control node from variable nodes different from the determined variable node and each relating to the symbol associated with the different variable node in the sequence corresponding to the equation; and determining the messages of a variable node to a control node that relate to the whole set of symbols so that the minimal value of said messages is equal to zero.

17 Claims, 6 Drawing Sheets

U.S. PATENT DOCUMENTS

2009/0083604 A1* 3/2009 Tong et al. .................. 714/752

OTHER PUBLICATIONS

Tanner, "A Recursive Approach to Low Complexity Codes", *IEEE Transactions on Information Theory*, vol. it-27, No. 5, Sep. 1981, p. 533-547.

Berrou et al., "Near Optimum Error correcting Coding and Decoding: Turbo-Codes", *IEEE Transactions on Communications*, vol. 44. No. 10, Oct. 1996.

Wiberg, "Codes and Decoding on General Graphs", *Linköping Studies in Science and Technology Dissertation No. 440*, Linköping, Sweden 1996, 106 pgs.

MacKay, "Good Error-Correcting Codes Based on Very Sparse Matrices", *IEEE Transactions on Information Theory*, vol. 45, No. 2, Mar. 1999, p. 399-431.

Richardson et al., "Design of Capacity-Approaching Irregular Low-Density Parity-Check Codes", *IEEE Transactions on Information Theory*, vol. 47, No. 2, Feb. 2001, p. 619-637.

Ryan, "An Introduction to LDPC Codes", Tuson, AZ, Aug. 19, 2003, 23 pgs.

Hu et al., "Regular and irregular progressive edge—growth Tanner graphs", *IEEE Transaction on Information Theory*, vol. 51, No. 1, Jan. 2005, p. 386-398.

International Search Report, Jun. 2, 2008.

French Written Opinion, Jun. 2, 2008.

"Log-Domain Decoding of LDPC Codes Over GF ($q$)"—by: Henk Wymeersch et al.,—IEEE Communications Society (Paris, France)—(pp. 772-776).

"Extended MinSum Algorithm for Decoding LDPC Codes over Gf($q$)"—by David Declercq etal., IEEE International Symposium on Information Theory (Adelaide-Australia)—(pp. 464-468).

"Reduced-Complexity Decoding of $Q$-ary LDPC Codes for Magnetic Recording"—by Hongxin Song et al.,—IEEE Transactions on Magnetics—vol. 39—No. 2—Mar. 2003—(pp. 1081-1087).

"Algorithmes Simplifies pour le Decodage de Codes LDPC non-binaires"—by Adrian Voicila et al.,—Sep. 6, 2005—(pp. 1-4).

"Fast Min-Sum Algorithms for Decoding of LDPC over $GF$(q)"—by Xiaofei Huang et al.,—Sep. 15, 2006—(pp. 1-4).

\* cited by examiner

METHOD AND DEVICE FOR DECODING LDPC CODES AND COMMUNICATION APPARATUS INCLUDING SUCH DEVICE

PRIORITY CLAIM

This application is a nationalization under 35 U.S.C. 371 of PCT Application No. PCT/FR2007/001963 filed Nov. 29, 2007, which claims priority to French Patent Application No. 0655275, filed Dec. 1, 2006, and incorporated by reference herein.

TECHNICAL FIELD

The present invention concerns a decoding method and device and communication apparatus including such a device.

BACKGROUND

The coding of information words (of a length generally denoted K) into code words (of a length generally denoted N, with N>K) is used when it is required to add redundancy to the information concerned in order to retrieve the entirety of the original information even if a part thereof is erroneous or lost, as in the case of the transmission of information in a channel suffering interference or the storage thereof on a medium subject to deterioration (such as scratches on an optical disk).

The decoding carried out on reception (or on reading in the case of storage) in order to retrieve the original information words generally comprises a first phase of correcting errors, which consists in retrieving precisely the code word sent (or stored) from the word received (vocabulary also utilized to designate the word read in the case of storage), despite any errors and thanks to the redundancy introduced, and then a "demapping" phase that consists in carrying out the inverse operation to that effected on coding.

In this context, there are known low-density parity check codes, referred to hereinafter as LDPC codes, as described for example in the paper "Low density parity check codes", by R. Gallager in IEEE Trans. Inform. Theory, vol. IT-8, pp. 21-28, 1962.

These codes are particularly interesting not only because they are very close to the capacity of the channel (Shannon limit) and they offer the best possible compromise between yield and performance (close to the Gilbert-Varshamov limit), but also because they allow message passing type iterative decoding.

Two main algorithms for decoding LDPC codes have been proposed before now, whether these are binary codes (for which the symbols representing the information are 0 or 1, i.e. taken in the Galois field GF(2)) or non-binary codes (for which the symbols are taken in the Galois field GF(q) with q>2).

The first, proposed in the paper cited above under the name "probabilistic decoding" is generally known (and denoted hereinafter) as SPA ("Sum-Product Algorithm") or BP ("Belief Propagation") decoding. This algorithm is generally qualified as optimal because SPA decoding converges toward the maximum likelihood on condition that the bipartite graph associated with the LDPC code does not contain cycles. In the case of non-binary LDPC codes, this algorithm is unusable in a real communication system, however, because of its very wide dynamic, which leads to high instability of the calculations effected. Moreover, it necessitates the production of a large number of products, which makes it complex, and it is dependent on the knowledge of the thermal noise.

The second, sub-optimal, decoding algorithm is primarily known by the name MSA ("Min-Sum Algorithm"). It is less complex than the SPA and independent of the knowledge of the thermal noise, but it suffers a loss of performance, in terms of the binary error rate, compared to the SPA that generally varies from 0.25 dB to 1 dB for an AWGN ("Additive White Gaussian Noise") channel, as a function of the yield, the irregularity or the length of the code used.

SUMMARY

In this context, the invention thus aims in particular to propose a solution for the decoding of LDPC codes, in particular non-binary LDPC codes, which combine good performance (for example compared to MSA) and reduced complexity compared to the optimal algorithm (SPA).

Thus the invention proposes a method of iterative decoding of a received word, represented by values of a signal, according to a parity check matrix code, of the type using passage of messages between variable nodes and control nodes of a bipartite graph associated with said matrix, characterized in that it comprises at least one of the following steps:

initialization of at least one message from a variable node, as a function of said values, by information representing the ratio between the probability of having the most probable symbol at the position corresponding to the variable node and the probability of having the current symbol at said position;

determination of at least one message, relating to a particular symbol, from a control node to a particular variable node, as the minimum value taken, among the sequences of symbols satisfying the equation at the control node using said particular symbol at the particular variable node, by the maximal value of the messages received at the control node from variable nodes other than the particular variable node and each relating to the symbol associated with that other variable node in the sequence satisfying the equation;

determination of the messages from a variable node to a control node which relate to all the symbols so that the minimal value of said messages is null.

The proposed solution (designated MMA ("Min-Max Algorithm") hereinafter) achieves good performance for reduced complexity, as will emerge from embodiments described hereinafter.

In practice, the step of initialization of the message from a variable node comprises the following steps:

for each symbol of the alphabet, determination of the sum of the binary logarithmic likelihood ratios relating to the non-null bits of the symbol and through the position corresponding to the variable node;

determination of the minimum of the sums determined; and subtraction from each sum thus determined of the minimum thus determined.

Moreover, this method can include a step of determination of a posteriori information relating to a variable node and to a symbol, like the sum of the initial message relating to the symbol at said variable node and all the messages received at the variable node and relating to the symbol, in which case the end of the iterative process can be determined as follows:

for each variable node, determination of the symbol for which the a posteriori information is minimal;

if the sequence of the symbols thus determined for all the variable nodes is a code word, use of said code word as an estimated word.

One embodiment of determining the messages from a variable node to a given control node comprises the following steps:

for each symbol, determination of the sum of the initial message relating to the symbol at said variable node and all the messages received at the variable node coming from a control node other than the given control node and relating to the symbol;

determination of the minimum of the sums thus determined;

for each symbol, subtraction of the minimum thus determined from the sum thus determined relating to the symbol.

For the practical implementation of the step of determination of at least one message from a control node to the variable node thus determined, the latter can comprise the following steps, for example:

determination, for each symbol, of an intermediate value equal to the minimal value taken by the maximal value of messages received at the control node from a portion only of the variable nodes associated with the control node;

determination of the minimal value taken by the maximal value from intermediate values and messages received from a variable node associated with the control node and not belonging to said portion.

These two steps can be more precisely described as follows:

determination, for each symbol, of an intermediate value equal to the minimum value taken, among the sequences of symbols associated with only a portion of the variable nodes connected to said control node and such that the sum of the symbols of the sequence multiplied by the coefficients corresponding in the matrix to said variable nodes is equal to said symbol thus determined, by the maximal value of the messages received at the control node from the variable nodes of said portion and each relating to the symbol associated with that variable node in said sequence;

recursive determination, for each symbol, of a new intermediate value equal to the minimum value taken, among the pairs of symbols in which the first symbol is associated with an intermediate value previously calculated and corresponding to a portion of the variable nodes and the second symbol is associated with a new variable node that does not belong to said portion, and such that the sum of the first symbol and the second symbol multiplied by the coefficient in the matrix of the corresponding variable node is equal to said symbol thus determined by the maximal value between the intermediate value previously calculated relative to the first symbol of said pair and the message received at the control node from the new variable node and relating to the second symbol of said pair. The new intermediate value, calculated in this way, corresponds to a new portion of variable nodes comprising the old portion and the new variable node.

This is a particularly practical embodiment, hereinafter denoted "forward-backward", which limits (preferably to two) the number of variable nodes (in particular dimensions) over which the minimum of the maximum must be searched for.

Moreover, in an embodiment proposed hereinafter ("selective implementation"), the method comprises a step of determination of the minimum, among the pairs of symbols belonging to the alphabet of the code, of the maximum of two values respectively associated with the two symbols of each pair, comprising the following substeps:

determination of sets each combining the symbols with which are associated values included in a particular range;

selection of sets, among the sets determined, such that the reunion of the sets selected contains at least a predetermined number of symbols (this predetermined number sufficing for calculation of the minimum of the maxima considered here and explained later under the name "min-max formula";

use, as maximum of two values, of the value associated with the symbol included in the set corresponding to the greater interval when the values are associated with symbols included in selected sets corresponding to separate ranges;

determination by comparison of the maximum of two values if the values are associated with symbols included in selected sets corresponding to the same range.

The grouping of the symbols into sets according to the value taken, in practice by the use of the integer part of that value, significantly reduces the number of symbols involved and simplifies comparison of the values associated with the symbols involved.

The code is a non-binary alphabet code, for example, in which case the method proposed is of particular interest.

The invention also proposes a device for iterative decoding of a received word, represented by values of a signal, according to a parity check matrix code, of the type using passage of messages between variable nodes and control nodes of a bipartite graph associated with said matrix, characterized in that it comprises:

means for initialization of at least one message from a variable node, as a function of said values, by information representing the ratio between the probability of having the most probable symbol at the position corresponding to the variable node and the probability of having the current symbol at said position; and/or means for determination of at least one message, relating to a particular symbol, from a control node to a particular variable node, as the minimum value taken, among the sequences of symbols satisfying the equation at the control node using said particular symbol at the particular variable node, by the maximal value of the messages received at the control node from variable nodes other than the particular variable node and each relating to the symbol associated with that other variable node in the sequence satisfying the equation; and/or means for determination of the messages from a variable node to a control node which relate to all the symbols so that the minimal value of said messages is null.

This device can have optional features corresponding to those envisaged above for the decoding method and the associated advantages.

The invention finally proposes communication apparatus comprising such a device.

BRIEF DESCRIPTION OF THE DRAWING

Other features and advantages of the invention will become apparent in the light of the following description, given with reference to the appended drawings in which.

DETAILED DESCRIPTION

Figure 1:
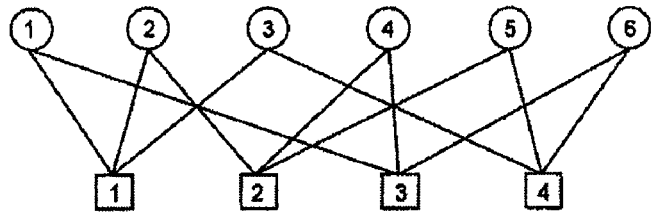
FIG. 1 gives by way of illustration an example of a parity matrix and the associated graph.

Two embodiments of the invention are described hereinafter, using the following notation common to both:

p, a strictly positive integer called the dimension (or degree of extension) of the Galois field;

$q=2^p$, called the cardinal of the Galois field;

P(X), an irreducible polynomial of degree p with coefficients in GF(2)={0,1};

GF(q)={0,1, . . . q−1}, the Galois field with q elements, the elements of GF(q) being called symbols.

Note that the Galois field GF(q) is classically defined as the quotient of the ring of polynomials GF(2)[X] by the ideal generated by the polynomial P(X), but here, to simplify the description, the Galois field GF(q) is identical to the set of integers {0,1, . . . , q−1} provided with "sum" and "product" operations described hereinafter (however calling each element of the Galois field a symbol in order to distinguish it from a "simple" integer).

Remember that, in order to define the "sum" and "product" operations supplying GF(q) of a field structure, each symbol $a \in GF(q)$ is identical to a binary sequence $a_0 a_1 \ldots a_{p-1}$ corresponding to writing a to base 2, in other words $$a = \sum_{i=0}^{p-1} a_i 2^i, \ a_i \in \{0, 1\}.$$

Furthermore, there is associated with the symbol a the polynomial $$a(X) = \sum_{i=0}^{p-1} a_i X^i,$$

with the consequence that $$a(2) = \sum_{i=0}^{p-1} a_i 2^i = a.$$

The binary values $a_0 a_1 \ldots a_{p-1}$ will be referred to hereinafter as the bits of the symbol $a \in GF(q)$.

The sum of two symbols $a, b \in GF(q)$, denoted $a \oplus b$, can then be defined by the bit by bit sum of the symbols a and b, in other words $(a \oplus b)_i = a_i + b_i$ mod 2.

The product of two symbols $a, b \in GF(q)$, denoted $a \otimes b$, is for its part defined by the product of the polynomials a(X) and b(X) modulo P(x), in other words $(a \otimes b)(X) = a(X) \cdot b(X)$ mod P(X).

An LDPC code on GF(q) is a linear code defined by a parity matrix $H \in M_{M,N}(GF(q))$ with a low density of non-null elements (where $M_{M,N}(GF(q))$ is the set of matrices with M rows and N columns with coefficients in GF(q)). The following concepts can then be introduced:

N, the code length, corresponds to the number of columns of the matrix H;

M, the number of parity checks, corresponds to the number of rows of the matrix H;

K=N−M, the dimension of the code, corresponds to the length of the information word;

$x=(x_1, x_2, \ldots, x_N)$ a q-ary code word, i.e. a sequence of symbols $x_n \in GF(q)$, such that $H \cdot x'=0$, where x' is the transposed vector of x, i.e. such that $$\bigoplus_{n=1,\ldots,N} h_{m,n} \otimes x_n = 0, \ \forall m = 1, \ldots, M,$$

where $h_{m,n}$ is the element in row m and column n of the matrix H;

$(x_{1,0}, x_{1,1}, \ldots x_{1,p-1}, x_{2,0}, x_{2,1}, \ldots x_{2,p-1}, \ldots, x_{N,0}, x_{N,1}, \ldots x_{N,p-1})$, where $x_{n,0}, x_{n,1}, \ldots, x_{n,p-1}$ are the bits of the symbol $x_n \in GF(q)$, the corresponding binary code word;

$G \in M_{K,N}(GF(q))$, the generator matrix of the code, i.e. a matrix of rank K such that $H \cdot G'=0$, where G' is the transposed matrix of G; a sequence $(a_1, a_2, \ldots, a_K) \in GF(q)^K$ is called a q-ary information word and coded into the form $(x_1, x_2, \ldots, x_N) = (a_1, a_2, \ldots, a_K) \cdot G$.

There is defined as the bipartite graph, or Tanner graph, associated with an LDPC code a graph containing N+M nodes divided into two types:

N variable nodes, corresponding to the columns of the matrix H;

M control nodes, corresponding to the rows of the matrix H;

and in which a variable node is connected to a control node if and only if the corresponding element of the matrix H defining the code is non-null.

The following notation is used hereinafter:

the indices m,n designate a control node, respectively a variable node;

H(m) designates the set of variable nodes connected to the control node m, its cardinal being called the degree of the control node m;

H(n) designates the set of control nodes connected to the variable node n, its cardinal being called the degree of the variable node n.

For more details on this type of graph, reference may be made to the paper "A recursive approach to low complexity codes" by R. M. Tanner in IEEE Trans. Inform. Theory, vol. 27, no. 5, pp. 533-547, 1981.

By way of illustration, FIG. 1 represents an example of a parity matrix of an LDPC code on GF(8) and the associated bipartite graph. To each edge of the bipartite graph there corresponds a non-null coefficient of H but, so as not to overcomplicate the graphical representation, the coefficients of H have not been shown on the edges of the graph.

Figure 2:
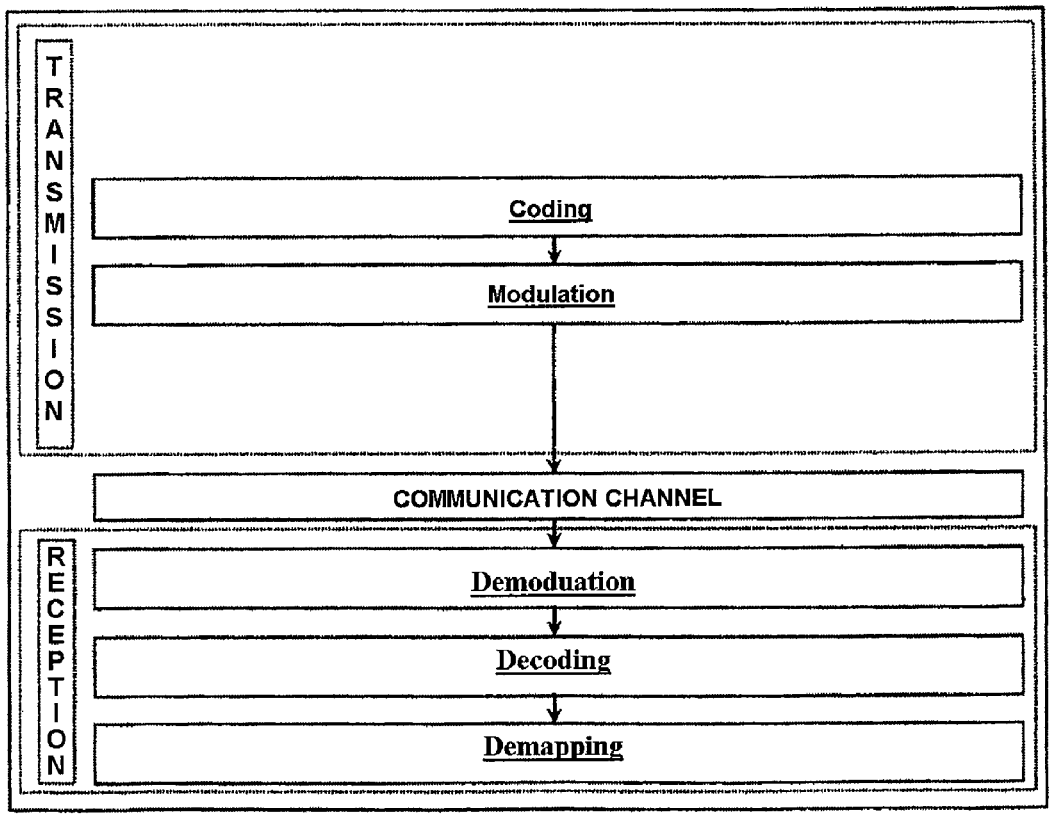
FIG. 2 represents the main elements of a communication system comprising a receiver conforming to the teachings of the invention.

FIG. 2 describes the schema of a communication system using a non-binary LDPC code and comprising receiver apparatus conforming to the teachings of the invention.

On transmission (i.e. in apparatus for sending information to be transmitted), in particular in a coding module, a binary information word $(a_{1,0}, a_{1,1}, \ldots a_{1,p-1}, \ldots, a_{K,0}, a_{K,1}, \ldots a_{K,p-1})$ is transformed into a q-ary information word $(a_1, \ldots, a_K)$, where $a_k$ is the symbol determined by the bits $a_{k,0} a_{k,1} \ldots a_{k,p-1}$, then the q-ary information word is coded into the q-ary code word $(x_1, x_2, \ldots, x_N) = (a_1, \ldots, a_K) \cdot G$. The q-ary code word $(x_1, x_2, \ldots, x_N)$ is then transformed into a binary code word $(x_{1,0}, x_{1,1}, \ldots x_{1,p-1}, x_{2,0}, x_{2,1}, \ldots x_{2,p-1}, \ldots, x_{N,0}, x_{N,1}, \ldots x_{N,p-1})$.

In practice, a natural way to pass directly from the binary information word to the binary code word is to use a binary generator matrix.

The binary code word generated by the coding module is transmitted to the modulation module, which transforms it into a signal to be sent on the communication channel.

The receiver apparatus comprises:
[a demodulation module, which determines the binary logarithmic likelihood ratios (LLRs), denoted $\lambda_{n,i}$, $n \in \{1, \ldots, N\}$, $i \in \{0, \ldots, p-1\}$, corresponding to the signal received on the communication channel according to the formula:

$$\lambda_{n,i} = \ln\left(\frac{Pr(x_{n,i} = 0 \mid \text{channel observation})}{Pr(x_{n,i} = 1 \mid \text{channel observation})}\right);$$

an error correction module (called hereinafter the decoder), which determines, by means of the decoding method proposed by the invention, two examples of which are given hereinafter, a q-ary sequence of length N (equal to the q-ary code word sent if decoding is successful) on the basis of the sequence of binary LLR received from the demodulation module;
a demapping module which transforms the q-ary sequence at the output of the decoder into an information word which, if decoding is successful, corresponds to the information word $(a_1, \ldots, a_K)$ sent.

A first example of a decoding method proposed by the invention is described next, executed in the error correction (or decoder) module to estimate a received word (or q-ary sequence) on the basis of the binary LLRs supplied by the demodulation module.

The proposed decoding is carried out iteratively and with passage of messages. This method thus comprises:
an initialization step on the basis of the binary LLRs supplied by the demodulation module;
iteration steps during which messages are exchanged between the variable nodes and the control nodes connected in the bipartite graph, the first iteration step being applied to the values resulting from the initialization step, whereas the subsequent steps are applied to the values resulting from the preceding step.

The initialization step begins with a calculation of the a priori information available at the variable nodes $n \in \{1, \ldots N\}$ concerning the symbols $a \in GF(q)$, denoted $\gamma_n(a)$, where, according to the decoding method described here:

$$\gamma_n(a) = \ln\left(\frac{Pr(x_n = s_n \mid \text{channel observation})}{Pr(x_n = a \mid \text{channel observation})}\right)$$

where $s_n$ denotes the most probable symbol for $x_n$, taking account of the channel observation.

Noting that:

$$\gamma_n(a) = \ln\left(\frac{Pr(x_n = 0 \mid \text{channel observation})}{Pr(x_n = a \mid \text{channel observation})}\right) -$$

$$\ln\left(\frac{Pr(x_n = 0 \mid \text{channel observation})}{Pr(x_n = s_n \mid \text{channel observation})}\right)$$

$$= \ln\left(\frac{Pr(x_n = 0 \mid \text{channel observation})}{Pr(x_n = a \mid \text{channel observation})}\right) -$$

$$\min_{s \in GF(q)} \ln\left(\frac{Pr(x_n = 0 \mid \text{channel observation})}{Pr(x_n = s \mid \text{channel observation})}\right)$$

the a priori information can be calculated as follows (hereinafter, $a_i$ denotes the $i^{th}$ bit of the symbol a), at each variable node n and for any symbol a of the alphabet:

$$\gamma_n(a) = \sum_{\substack{i=0,\ldots,p-1 \\ \text{bit } a_i = 1}} \lambda_{n,i}$$

$$\gamma_n = \min_{a \in GF(q)} \gamma_n(a)$$

$$\gamma_n(a) = \gamma_n(a) - \gamma_n$$

Each a priori information $\gamma_n(a)$ therefore provides a measurement of the reliability of the symbol a (for the position n) in the form of a distance to the most probable symbol.

The initialization step can then continue (and conclude) with the initialization of the messages from the variable nodes to the control nodes (also called extrinsic information). The message sent by the variable node $n \in \{1, \ldots N\}$ to the control node $m \in H(n)$ concerning the symbol $a \in GF(q)$ is denoted $\alpha_{m,n}(a)$.

According to the decoding method proposed here, the extrinsic information is initialized on the basis of the a priori information as follows:

$$\alpha_{m,n}(a) = \gamma_n(a).$$

Figure 3:
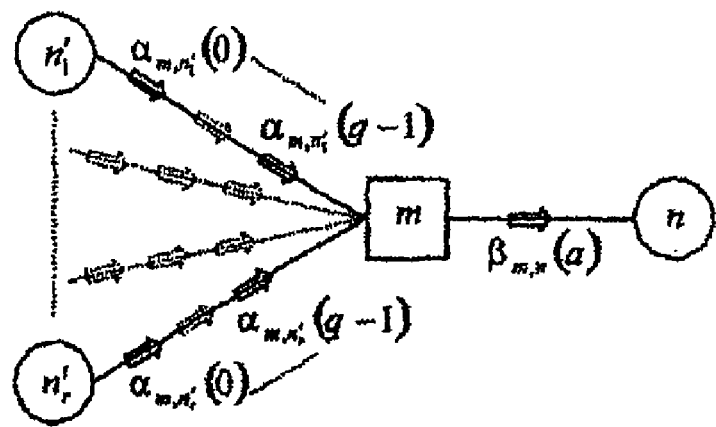
FIG. 3 represents diagrammatically the technique for passage of messages between the variable nodes and the control nodes.
Figure 3:
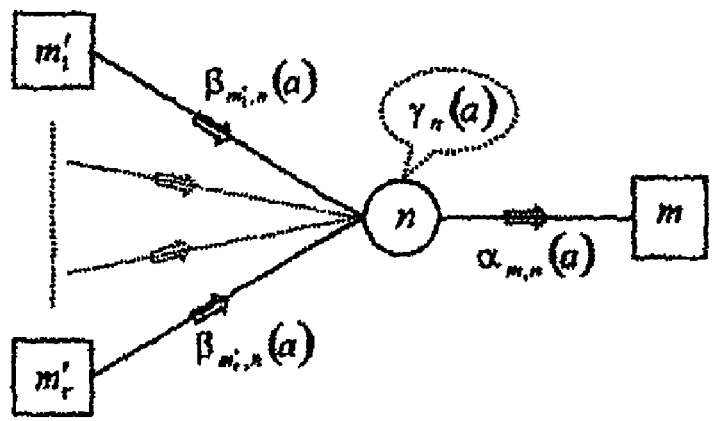
Figure 3:
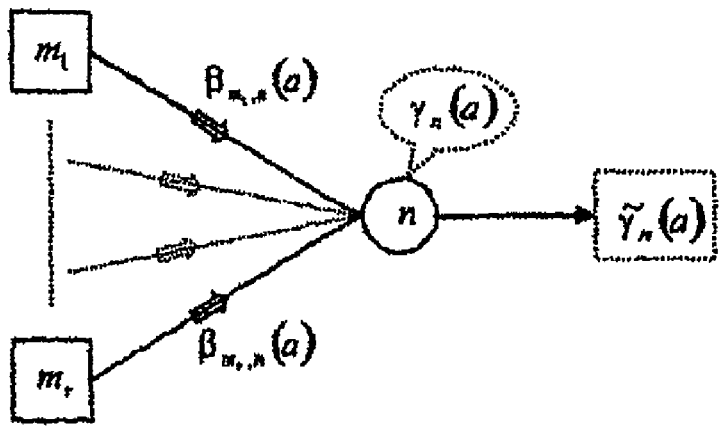

Each iteration step is executed by the passage of messages between the nodes of the bipartite graph, as represented diagrammatically in FIG. 3, and thus comprises the following sub-steps:
calculation of the messages from the control nodes to the variable nodes. The message sent by the control node $m \in \{1, \ldots M\}$ to the variable node $n \in H(m)$ concerning the symbol $a \in GF(q)$ is denoted $\beta_{m,n}(a)$. This message is calculated as a function of the messages $\alpha_{m,n}(a')$ received by the control node m from the variable nodes $n' \in H(m) - \{n\}$ concerning all the symbols $a' \in GF(q)$ where, according to the decoding method proposed here:

$$\beta_{m,n}(a) = \min_{\substack{a_{n'} \in GF(q): n' \in H(m) - \{n\} \\ (\oplus_{n' \in H(m)-\{n\}} h_{m,n'} \otimes a_{n'}) \oplus (h_{m,n} \otimes a) = 0}} \max_{n' \in H(m) - \{n\}} \alpha_{m,n'}(a_{n'})$$

calculation of the a posteriori information. The a posteriori information calculated at the variable node $n \in \{1, \ldots N\}$ concerning the symbol $a \in GF(q)$ is denoted $\tilde{\gamma}_n(a)$. This information is calculated as a function of the a priori information $\gamma_n(a)$ available at the variable node n and of the messages $\beta_{m,n}(a)$ received by the variable node n from the control nodes $m \in H(n)$ concerning the symbol $a \in GF(q)$, here according to the formula:

$$\tilde{\gamma}_n(a) = \gamma_n(a) + \sum_{m \in H(n)} \beta_{m,n}(a)$$

calculation of the messages from the variable nodes to the control nodes (or extrinsic information). The (new) message $\alpha_{m,n}(a)$ is calculated as a function of the a priori information $\gamma_n(a)$ available at the variable node n and of the messages $\beta_{m',n}(a)$ received by the variable node n from the control nodes m'∈H(n)−{m} concerning the symbol a∈GF(q), here according to the formulas:

$$\alpha_{m,n}(a) = \gamma_n(a) + \sum_{m' \in H(n)-\{m\}} \beta_{m',n}(a) = \tilde{\gamma}_n(a) - \beta_{m,n}(a)$$

$$\alpha_{m,n} = \min_{a \in GF(q)} \alpha_{m,n}(a)$$

$$\alpha_{m,n}(a) = \alpha_{m,n}(a) - \alpha_{m,n}$$

Accordingly, for the most probable symbol $s_n$ (i.e. such that $\alpha_{m,n} = \alpha_{m,n}(s_n)$), there is always on each iteration $\alpha_{m,n}(s_n) = 0$.

On each iteration, a hard decision corresponding to the most probable symbols can be calculated on the basis of the a posteriori information $\tilde{\gamma}_n(a)$, n∈{1, ... N}, a∈GF(q). As already stated, the most probable symbols are those that produce the minimum a posteriori information $\tilde{\gamma}_n(a)$. If the sequence of these most probable symbols corresponds to a code word, the code word found is considered to be the code word originally sent: decoding is stopped and the code word found is passed to the demapping module.

On the other hand, if the sequence of these most probable symbols does not correspond to a code word, decoding continues until a predetermined maximum number of iterations is reached, in which case decoding is considered to have failed.

The benefit of the min-max formula used in the calculation of the messages from the control nodes $\beta_{m,n}(a)$ can be explained as follows.

Hereinafter there are fixed a control node m, a variable node n connected to the control node m, and a symbol a∈GF (q). The other variable nodes (i.e. other than the variable node n) connected to the control node m are denoted $n_1, \ldots, n_d$. Accordingly, using the previous notation: $H(m) = \{n, n_1, \ldots, n_d\}$.

The message $\beta_{m,n}(a)$ is calculated as a function of the messages received by the control node m from the variable nodes $n_1, \ldots, n_d$ (for each symbol of GF(q)).

If a sequence of symbols $(a_1, \ldots, a_d)$ is considered comprising a symbol for each variable node $n_1, \ldots, n_d$, such a sequence will be referred to hereinafter as admissible if the sequence $(a, a_1, \ldots, a_d)$—comprising a symbol for each variable node $n, n_1, \ldots, n_d$—satisfies the check m, i.e. the equation from the parity matrix in row m:

$$\left( \bigoplus_{k=1}^{d} h_{m,n_k} \otimes a_k \right) \oplus (h_{m,n} \otimes a) = 0$$

An admissible sequence is therefore liable to constitute a portion of a code word.

The computation of $\beta_{m,n}(a)$ takes into account all the admissible sequences. Accordingly, for each admissible sequence $(a_1, \ldots, a_d)$, it is possible to calculate the maximum of the messages received by the control node m from the variable nodes $n_1, \ldots, n_d$ concerning the symbols of this sequence which gives a measurement of the reliability of this sequence (a low value corresponding to reliable information, as stated supra). To be precise, it is a question of:

$$\max_{k=1,\ldots,d} (\alpha_{m,n_k}(a_k)).$$

If this maximum is denoted $M(a_1, \ldots, a_d)$, the message $\beta_{m,n}(a)$ is then equal to the minimum of all the maximums calculated for all the admissible sequences, i.e.:

$$\beta_{m,n}(a) = \min_{\substack{(a_1,\ldots,a_d) \\ admissible}} M(a_1, \ldots, a_d)$$

$$= \min_{\substack{(a_1,\ldots,a_d) \\ admissible}} \left( \max_{k=1,\ldots,d} (\alpha_{m,n_k}(a_k)) \right).$$

Thus this minimum targets the most probable of the admissible sequences and gives a measure of its reliability.

In this way information is obtained on the reliability of the symbol a at the position n that takes account of the other information available at the control node m.

A first practical method is proposed hereinafter for effecting the calculation of the messages $\beta_{m,n}(a)$ without having to list all the admissible sequences each time. This first embodiment uses a "forward-backward" type method and can be expressed as follows.

Min-Max Algorithm

Input: $\lambda_{1,0}, \lambda_{1,1}, \ldots, \lambda_{1,p-1}, \lambda_{2,0}, \lambda_{2,1}, \ldots, \lambda_{2,p-1}, \ldots, \lambda_{N,0}, \lambda_{N,1}, \ldots, \lambda_{N,p-1}$—binary LLRs Output: $s_1, s_2, \ldots, s_N$—q-ary sequence Initialization A Priori Information For each variable node $n \in \{1, 2, \ldots, N\}$ do:

$$\gamma_n(a) = \sum_{\substack{i=0,\ldots,p-1 \\ bit\ a_i=1}} \lambda_{n,i}; \qquad ] \; \forall\, a \in GF(q)$$

$$\gamma_n = \min_{a \in GF(q)} \gamma_n(a);$$

$$\gamma_n(a) = \gamma_n(a) - \gamma_n; \qquad ] \; \forall\, a \in GF(q)$$

Initialization of the Messages from the Variable Nodes

For each variable node $n \in$
$\{1, 2, \ldots, N\}$ and each control node $m \in H(n)$ do:

$$\alpha_{m,n}(a) = \gamma_n(a); \qquad ] \; \forall\, a \in GF(q)$$

Iterations

Messages from the Control Nodes

For each control node $m \in \{1, 2, \ldots, M\}(H(m) = \{n_1, n_2, \ldots, n_d\},$ $d$ consequently being the cardinal of $H(m)$)

do:

// forward $$F_1(a) = \alpha_{m,n_1}(h_{m,n_1}^{-1} \otimes a); \qquad ] \; \forall\, a \in GF(q)$$

-continued $$F_j(a) = \min_{\substack{a', a'' \\ a' \oplus (h_{m,n_j} \otimes a'') = a}} (\max(F_{j-1}(a'), \alpha_{m,n_j}(a'')));  \quad \left.\begin{array}{l} \forall a \in GF(q), \\ \forall j = 2, \ldots, \\ d-1 \end{array}\right.$$

// backward $$B_d(a) = \alpha_{m,n_d}(h_{m,n_d}^{-1} \otimes a); \qquad \qquad ] \forall a \in GF(q)$$

$$B_j(a) = \min_{\substack{a', a'' \\ a' \oplus (h_{m,n_j} \otimes a'') = a}} (\max(B_{j+1}(a'), \alpha_{m,n_j}(a'')));$$

$$\forall a \in GF(q),$$
$$\forall j = d-1, \ldots, 2$$

// messages from the control node $m$ $$\beta_{m,n_1}(a) = B_2(a); \qquad \qquad ] \forall a \in GF(q),$$

$$\beta_{m,n_j}(a) = \min_{\substack{a', a'' \\ a' \oplus a'' = h_{m,n_j} \otimes a}} (\max(F_{j-1}(a'), B_{j+1}(a'')));$$

$$\forall a \in GF(q),$$
$$\forall j = 2, \ldots, d-1$$

$$\beta_{m,n_d}(a) = F_{d-1}(a); \qquad \qquad ] \forall a \in GF(q)$$

A Posteriori Information

For each variable node $n \in \{1, 2, \ldots, N\}$ do:

$$\tilde{\gamma}_n(a) = \gamma_n(a) + \sum_{m \in H(n)} \beta_{m,n}(a)' \qquad ] \forall a \in GF(q)$$

Hard Decision: Choice of the Most Probable Symbols

For each variable node $n \in \{1, 2, \ldots, N\}$ do:

$$s_n = \operatorname*{argmin}_{a \in GF(q)} \tilde{\gamma}_n(a);$$

If $\bigoplus_{n \in H(m)} (h_{m,n} \otimes s_n) = 0, \forall m \in \{1, 2, \ldots, M\}$ then EXIT;

Messages from the Variable Nodes

For each variable node $n \in$
$$\{1, 2, \ldots, N\} \text{ and each control node } m \in H(n) \text{ do:}$$

$$\alpha_{m,n}(a) = \tilde{\gamma}_n(a) - \beta_{m,n}(a); \qquad ] \forall a \in GF(q)$$

$$\overline{\alpha}_{m,n} = \min_{a \in GF(q)} \alpha_{m,n}(a);$$

$$\alpha_{m,n}(a) = \alpha_{m,n}(a) - \overline{\alpha}_{m,n}; \qquad ]$$

$$\forall a \in GF(q)$$

Figure 4:
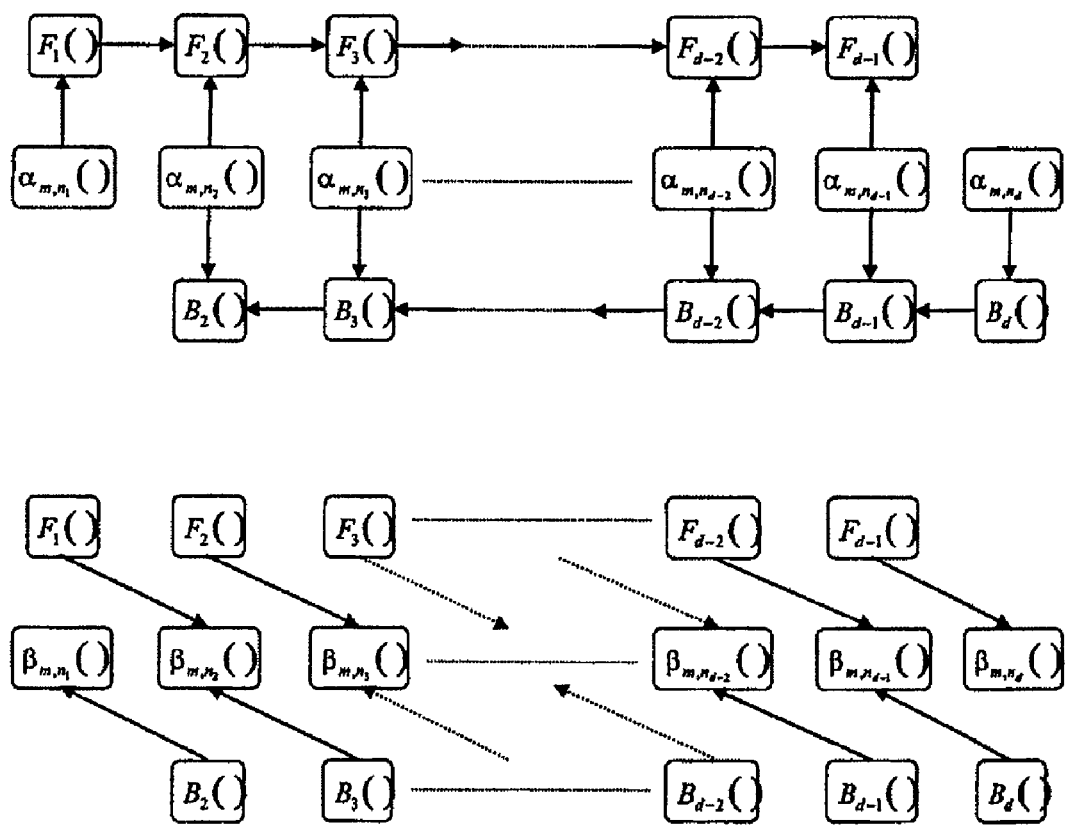
FIG. 4 illustrates the "forward-backward" method used in the first embodiment.

The "forward-backward" method used in this embodiment is illustrated in FIG. 4. The notation $\alpha_{m,n}(\ )$ designates the set of messages $\alpha_{m,n}(a)$, $a \in GF(q)$; likewise for $F_j(\ )$, $B_j(\ )$ and $\beta_{m,n}(\ )$. The use of intermediate quantities (or values) $F_j(\ )$, $B_j(\ )$ means that formulas with two symbols (a', a'') are involved, i.e. each time the minimum of the maximum values is to be determined for only two dimensions.

Moreover, the "min-max" type formulas used hereinabove to determine $F_j(a)$ and $B_j(a)$ in the calculation of the messages from the control nodes can be executed as follows.

To simplify the explanation, the value of the coefficients of the matrix H is ignored here (i.e. it is considered that $h_{m,n}=1$, $\forall n \in H(m)$), so that such a formula can be expressed in the form:

$$f(a) = \min_{\substack{a', a'' \in GF(q) \\ a' \oplus a'' = a}} (\max(f'(a'), f''(a''))),$$

and its calculation performed as follows:

For $a \in GF(q)$ initialize $f(a) = +\infty$;

For $a' \in GF(q)$ do:

For $a'' \in GF(q)$ do:

$a = a' \oplus a''$;

$f = \max(f'(a'), f''(a''))$;

If $f < f(a)$ then $f(a) = f$;

Note that the complexity of this calculation is proportional to $q^2$.

Note further that, given the formulas used, the dynamic of the messages exchanged is low and consequently no normalization is necessary. Moreover, the solution proposed is independent of the knowledge of the thermal noise.

There is described now a second embodiment of the invention in which the low dynamic referred to above is used to reduce complexity. The aim in particular is to reduce the cost of the min-max calculations of the form $$f(a) = \min_{\substack{a', a'' \in GF(q) \\ a' \oplus a'' = a}} (\max(f'(a'), f''(a'')))$$

It is found in practice (and furthermore demonstrated in the appendix infra) that, for this calculation, it suffices to consider only the symbols a' and a'' corresponding to the q+1 lowest values among $f'(a')$ and $f''(a'')$ (i.e. 2·q values in total).

The number of symbols a', respectively a'', corresponding to the q+1 lowest values among $f'(a')$ and $f''(a'')$ are denoted q', q'', then q'+q''=q+1 and the complexity of the above calculation becomes proportional to $$q' \cdot q'' \in \left\{ q, q+1, \ldots, \frac{q}{2}\left(\frac{q}{2}+1\right) \right\}.$$

Reducing the complexity of the calculation of $f(a)$, $a \in GF(q)$ could then be envisaged, on condition that the values $f'(a')$ and $f''(a'')$ are sorted. Now, sorting the values $f'(a'')$ and $f''(a'')$ would add non-negligible complexity both in terms of the number of operations and in terms of memory access.

To avoid sorting the values $f'(a')$ and $f''(a'')$, here the symbols a' and a'' are stored according to the integer part of $f'(a')$ and $f''(a'')$. The sets $\Delta'_k$ (respectively $\Delta''_k$) containing the symbols a' such as $\lfloor f'(a') \rfloor = k$ respectively the symbols a" such that $\lfloor f''(a'') \rfloor = k$) where the operator $\lfloor \ \rfloor$ designates the integer part are then denoted:

$$\Delta'_k = \{a' \in GF(q) | \lfloor f'(a') \rfloor = k\}$$

$$\Delta''_k = \{a'' \in GF(q) | \lfloor f''(a'') \rfloor = k\}$$

It would then suffice to determine the smallest integer E such that the number of symbols a' and a" contained in the sets $\Delta' = \Delta'_0 \cup \ldots \cup \Delta'_E$ and $\Delta'' = \Delta''_0 \cup \ldots \cup \Delta''_E$ is greater than or equal to q+1; then to calculate $f(a)$ using:

$$f(a) = \min_{\substack{a' \in \Delta', a'' \in \Delta'' \\ a' \oplus a'' = a}} (\max(f'(a'), f''(a'')))$$

Of course, using this method, it may be necessary to use more symbols than the cardinal of the field plus one (>q+1), but this avoids sorting the values $f'(a')$ and $f''(a'')$.

The use of the sets $\Delta'_k$ and $\Delta''_k$ has a two-fold benefit:

the number of symbols (and thus the number of loops) necessary for calculating the formulas of "min-max" type is reduced;

most of the maximum calculations become obsolete. Thus the maximum $\max(f'(a'), f''(a''))$ must be calculated only if the symbols a' and a" are in sets of the same rank, i.e. $a' \in \Delta'_k$, and $a'' \in \Delta''_k$, where k'=k". In the other cases, the maximum corresponds to the symbol from the set of maximal rank (i.e. $\max = f'(a')$ if k'>k" and $\max = f''(a'')$ if k">k').

This method is used as follows:

a predefined dynamic of the a priori information is defined, so that the integer part of the messages exchanged provides a sufficiently refined criterion for distinguishing between the symbols of the alphabet (here the Galois field GF(q)). A constant AI ("Average a priori Information") is used and in the initialization step, after the calculation of the a priori information (cf. first embodiment), there is calculated:

$$\gamma_{ave} = \text{average of the } \{\gamma_n(a) | n \in \{1,2,\ldots N\}, a \in GF(q)\};$$

then the a priori information is normalized:

$$\gamma_n(a) = \frac{AI}{\gamma_{ave}} \cdot \gamma_n(a); \text{ for } n \in \{1, \ldots, N\}, a \in GF(q)$$

there is defined a maximum dynamic of the messages from the control nodes, in order to have a smaller number of sets $\Delta'_k$ and $\Delta''_k$. A constant COT ("Cut Off Threshold") is used for this and the "min-max" formula is calculated as described hereinafter:

```
// determine the sets Δ'_k and Δ''_k
for a ∈ GF(q) do
    if (k = ⌊f'(a')⌋) < COT then add a to Δ'_k
    if (k = ⌊f''(a'')⌋) < COT then add a to Δ''_k
// determine the number sets to use (denoted E)
card = 0;
for (E = 0; E < COT – 1; E++)
    if(card += (card(Δ'_E) + card(Δ''_E))) ≥ q + 1 then exit the loop.
```

Thus E is defined in such a manner that the sets $\Delta' = \Delta'_0 \cup \ldots \cup \Delta'_E$ and $\Delta'' = \Delta''_0 \cup \ldots \cup \Delta''_E$ combine at least q+1 elements (as stated supra), except in cases where the maximum value for E (i.e. the value COT−1) is reached.

On exit from the loop, E thus defines the number of sets that will be used. Note that it is possible for the loop to run to full term, in which case E=COT−1 (maximum value of E reached) and card ($\Delta' \cup \Delta''$) can then be less than q+1 (thus the number of symbols a' and a" that will be used is less than q+1 and, consequently, the complexity of the "min-max" calculation will be even further reduced). This generally occurs during the final iterations, when decoding is well advanced and the decoder is querying only a very small number of symbols.

If necessary, to highlight the fact that the integer E is determined from the sets $\Delta'_k$ and $\Delta''_k$, $0 \leq k < COT$, the notation $E = E(\Delta', \Delta'')$ is used.

The following algorithm is therefore proposed:

```
// calculation of the "min-max" formula (selective implementation)
for a ∈ GF(q) intitalize f(a) = COT;
for k' = 0, ... , E and a' ∈ Δ'_k', do:
    for k" = 0, ... , k' – 1 and a" ∈ Δ''_k" do:
        a = a' ⊕ a";
        // note that f'(a') = max(f'(a'), f''(a")) because k' > k"
        if f'(a') < f(a) then f(a) = f'(a')
for k" = 0, ... , E and a" ∈ Δ''_k" do:
    for k" = 0, ... , k" – 1 and a' ∈ Δ'_k' do:
        a = a' ⊕ a";
        // note that f"(a") = max(f'(a'), f"(a")) because k" > k'
        if f"(a") < f(a) then f(a) = f"(a")
for k = 0, ... , E do:
    for a' ∈ Δ'_k and a" ∈ Δ''_k do:
        a = a' ⊕ a";
        f = max(f'(a'), f"(a"))
        if f < f(a) then f(a) = f
```

There follows next a complete description of the second embodiment of the algorithm proposed by the present invention.

Three types of sets are defined:

sets $A_j\Delta_k$: contain the symbols $a \in GF(q)$ such that $\lfloor \alpha_{m,n_j}(a) \rfloor = k$, sets $F_j\Delta_k$: contain the symbols $a \in GF(q)$ such that $\lfloor F_j(a) \rfloor = k$, sets $B_j\Delta_k$: contain the symbols $a \in GF(q)$ such that $\lfloor B_j(a) \rfloor = k$.

The notation of the first embodiment is retained in this description.

The algorithm proposed in this second embodiment is then as follows:

Min-Max Algorithm

Input: $\lambda_{1,0}, \lambda_{1,1}, \ldots, \lambda_{1,p-1}, \lambda_{2,0}, \lambda_{2,1}, \ldots, \lambda_{2,p-1}, \ldots, \lambda_{N,0}, \lambda_{N,1}, \ldots, \lambda_{N,p-1}$—binary LLRs Output: $s_1, s_2, \ldots, s_N$—q-ary sequence defined AI, for example AI=4.647 for GF(8)

define COT, for example COT=10 for GF(8)

Initialization
A Priori Information

For each variable node $n \in \{1, 2, \ldots, N\}$ do:

$$\gamma_n(a) = \sum_{\substack{i=0,\ldots,p-1 \\ \text{bit } a_i = 1}} \lambda_{n,i}; \quad \Big] \, \forall \, a \in GF(q)$$

$$\gamma_n = \min_{a \in GF(q)} \gamma_n(a);$$

$$\gamma_n(a) = \gamma_n(a) - \gamma_n; \quad ] \, \forall \, a \in GF(q)$$

Do: $\gamma_{ave}$ = average of the
$\{\gamma_n(a) \mid n \in \{1, 2, \ldots N\}, a \in GF(q)\}$;

For each variable node $n \in \{1, 2, \ldots, N\}$ do:

$$\gamma_n(a) = \frac{AI}{\gamma_{ave}} \cdot \gamma_n(a); \quad \Big] \, \forall \, a \in GF(q)$$

Initialization of the Messages from the Variable Nodes

For each variable node $n \in \{1, 2, \ldots, N\}$ do: and each control node $m \in H(n)$ do:

$$\alpha_{m,n}(a) = \gamma_n(a); \quad ] \, \forall \, a \in GF(q)$$

Iterations
Messages from the Control Nodes

For each control node $m \in \{1, 2, \ldots, M\}$ (setting $H(m) = \{n_1, n_2, \ldots, n_d\}$) do:

// sets $A_j \Delta_k$

Determine the sets $A_j \Delta_k$; $\quad ] \, \forall \, a \in GF(q), \, \forall \, j = 1, \ldots, d$ // forward $$F_1(a) = \alpha_{m,n_1}\left(h_{m,n_1}^{-1} \otimes a\right); \quad \Big] \, \forall \, a \in GF(q)$$
Determine the sets $F_1 \Delta_k$;

$$E = E(F_{j-1}\Delta, A_j\Delta);$$

$$F_j(a) = \min_{\substack{a' \in \bigcup_{k=0}^{E} F_{j-1}\Delta_{k'}, \, a'' \in \bigcup_{k=0}^{E} A_j \Delta_{k''} \\ a' \oplus (h_{m,n_j} \otimes a'') = a}} (\max(F_{j-1}(a'), \alpha_{m,n_j}(a'')));$$

Determine the sets $F_j \Delta_k$; $\quad \Big] \, \forall \, a \in GF(q)$ $$\Big] \, \forall \, j = 2, \ldots, d-1$$

// backward $$B_d(a) = \alpha_{m,n_d}\left(h_{m,n_d}^{-1} \otimes a\right); \quad \Big] \, \forall \, a \in GF(q)$$
Determine the sets $B_d \Delta_k$;

$$E = E(B_{j+1}\Delta, A_j\Delta);$$

$$B_j(a) = \min_{\substack{a' \in \bigcup_{k=0}^{E} B_{j+1}\Delta_{k'}, \, a'' \in \bigcup_{k=0}^{E} A_j \Delta_{k''} \\ a' \oplus (h_{m,n_j} \otimes a'') = a}} (\max(B_{j+1}(a'), \alpha_{m,n_j}(a'')));$$

Determine the sets $B_j \Delta_k$; $\quad \Big] \, \forall \, a \in GF(q)$ $$\Big] \, \forall \, j = d-1, \ldots, 2$$

// messages from the control node $m$ $$\beta_{m,n}(a) = B_2(a); ] \, \forall \, a \in GF(q) \quad ] \, \forall \, a \in GF(q)$$

-continued $$E = E(F_{j-1}\Delta, A_j\Delta);$$

$$\beta_{m,n_j}(a) = \min_{\substack{a' \in \bigcup_{k=0}^{E} F_{j-1}\Delta_k, a'' \in \bigcup_{k=0}^{E} B_{j+1}\Delta_{k''} \\ a' \oplus a'' = h_{m,n_j} \otimes a}} (\max(F_{j-1}(a'), B_{j+1}(a'')));  \quad \forall\, a \in GF(q)$$

$$\forall\, j = 2, \ldots, d-1$$

$$\beta_{m,n_d}(a) = F_{d-1}(a);] \forall\, a \in GF(q) \quad ] \forall\, a \in GF(q)$$

A Posteriori Information

For each variable node $n \in \{1, 2, \ldots, N\}$ do:

$$\tilde{\gamma}_n(a) = \gamma_n(a) + \sum_{m \in H(n)} \beta_{m,n}(a); \quad ] \forall\, a \in GF(q)$$

Hard Decision: Choice of the Most Probable Symbols

For each variable node $n \in \{1, 2, \ldots, N\}$ do:

$$s_n = \operatorname*{argmin}_{a \in GF(q)} \tilde{\gamma}_n(a);$$

If $\bigoplus_{n \in H(m)} (h_{m,n} \otimes s_n) = 0, \forall\, m\{1, 2, \ldots, M\}$ then EXIT;

Messages from the Variable Nodes

For each variable node $n \in$ $\{1, 2, \ldots, N\}$ do: and each control node $m \in H(n)$ do:

$$\alpha_{m,n}(a) = \tilde{\gamma}_n(a) - \beta_{m,n}(a); \quad ] \forall\, a \in GF(q)$$

$$\alpha_{m,n} = \min_{a \in GF(q)} \alpha_{m,n}(a);$$

$$\alpha_{m,n}(a) = a_{m,n}(a) - \alpha_{m,n}; \quad ] \forall\, a \in GF(q)$$

In the above calculations, the algorithm described above ("//calculation of the "min-max" formula (selective implementation)") is used to determine the result of each of the "min-max" type formulas.

Moreover, as stated above, in the initialization step, the dynamic of the a priori information is modified so that the integer portion of the messages exchanged provides a criterion that is sufficiently refined to distinguish between the symbols of the alphabet (here the Galois field GF(q)). In practice, $\gamma_{ave}$ can be calculated only periodically, knowing that its variation between two consecutive code words is negligible.

The parameters referred to hereinabove are preferably chosen so that:

after multiplication by $$\frac{AI}{\gamma_{ave}},$$

the values of the a priori information $\Delta_n(a)$ are sufficiently spaced, so that the steps of type $\Delta_k$ contain few symbols;

the value of COT, which can be determined by means of simulations, must be relatively low because it determines the number of sets of type $\Delta_k$ that will be used.

Note on this subject that the values of the constants AI and COT on GF(8) given by way of example above have been determined by means of simulations and can be used for an AWGN channel and for any LDPC code on GF(8), independently of the characteristics of the code (length, irregularity, yield) or of the modulation used.

Figure 5:
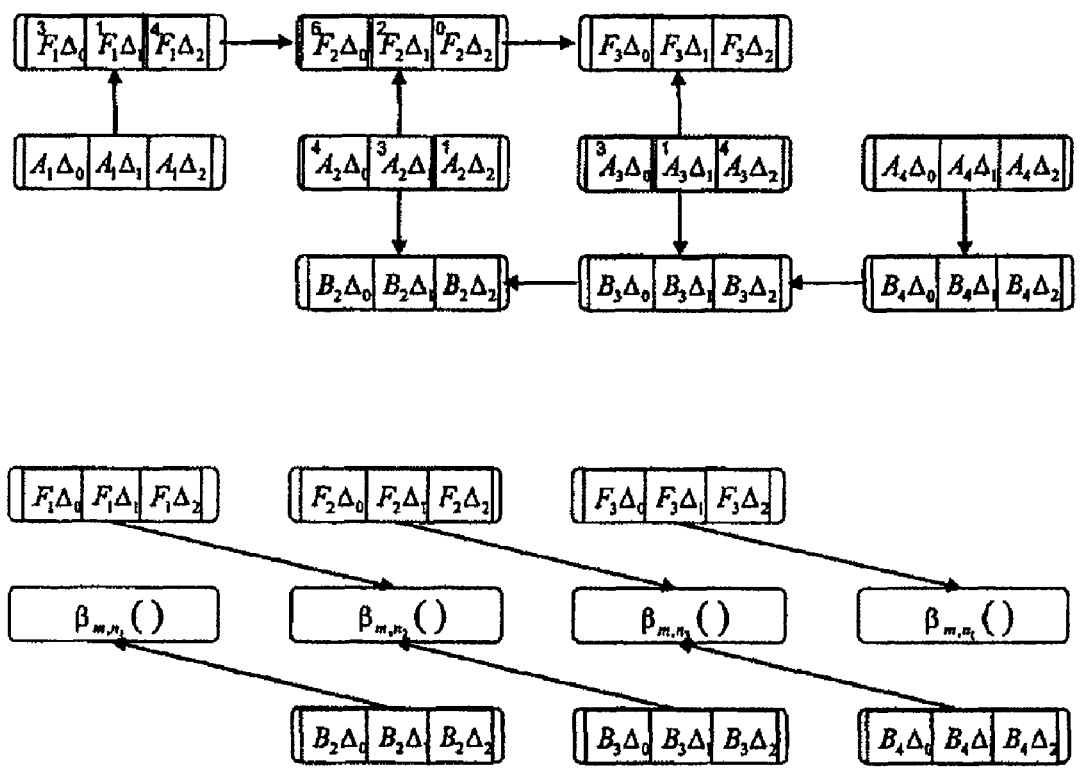
FIG. 5 gives by way of explanation an illustration of the techniques proposed in the second embodiment.

The conjoint use of the sets $A_j\Delta_k$, $F_j\Delta_k$, $B_j\Delta_k$ and of the "forward-backward" method is shown diagrammatically and for purely explanatory purposes in FIG. 5, for a constant COT equal to 3 and a control node m of degree 4 (H(m)={$n_1, n_2, n_3, n_4$}).

In this example based on the Galois field i.e. GF(8), it is considered that the sets $F_1\Delta_k$, k=0,1,2 respectively contain 3, 1 and 4 symbols and that the sets $A_1\Delta_k$, k=0,1,2 respectively contain 4, 3 and 1 symbols. Then, for the calculation of the values $F_2(a)$, $a \in GF(8)$, it suffices to use the values $F_1(a')$ and $\alpha_{m,n_2}(a'')$ corresponding to the symbols $a' \in F_1\Delta_k$ and $a'' \in A_2\Delta_k$ only for k=0 and k=1 (thus four symbols a' and seven symbols a'', that is a total of 11 symbols, which is sufficient because there must be at least q+1=9 symbols in total).

Once the values $F_2(a)$, $a \in GF(8)$ have been calculated, the symbols $a \in GF(8)$ are stored in the sets $F_2\Delta_k$, k=0,1,2 (according to the integer parts of the calculated values). Assume that the sets $F_2\Delta_k$, k=0,1,2 respectively contain 6, 2 and 0 symbols. Then, for the calculation of the values $F_3(a)$, $a \in GF(8)$, it suffices to use only the values $F_2(a')$ and $\alpha_{m,n_3}(a'')$ corresponding to the six symbols $a' \in F_2\Delta_0$ and to the three symbols $a'' \in A_3\Delta_0$ (that is a total of nine symbols).

There is described hereinafter the result of comparative simulations of the various algorithms envisaged hereinabove and in the prior art, here for LDPC on GF(8) or binary codes.

MMA ("Min-Max Algorithm") denotes the algorithm that is the subject matter of the present invention, "standard implementation" its first embodiment above and "selective implementation" its second embodiment.

All the codes used are irregular LDPC codes. The bipartite graph is constructed using the "Progressive Edge Growth" algorithm described in "*Regular and irregular progressive edge—growth Tanner graphs*", X. Y. Hu, E. Eleftheriou, D. M. Arnold, IEEE Trans. Inform. Theory, vol. 51, no. 1, pp. 386-398, 2005. In the case of an LDPC code on GF(8), the edges of the bipartite graph correspond to the places of the non-null coefficients in the parity matrix. These coefficients have been chosen at random. The irregularity of the codes used will not be indicated hereinafter, but the average degree of the variable nodes, denoted $d_n^{ave}$, will be indicated.

The irregularities of the binary LDPC codes have been optimized by "density evolution" as described in "*Design of*

*capacity approaching irregular low density parity check codes*", T. J. Richardson, M. A. Shokrollahi, R. L. Urbanke, IEEE Trans. Inform. Theory, vol. 47, no. 2, pp. 619-637, 2001. Nevertheless, the irregularity corresponding to a good binary code is not suitable for obtaining a good q-ary code (and vice-versa). Generally, the more the cardinal of the Galois field increases, the more the codes used must be "hollow" (fewer edges in the bipartite graph), whence the difference between the average degrees of the variable nodes for the binary codes and for the codes on GF(8) used hereinafter.

The simulations have been carried out for an AWGN channel, using QPSK modulation. Moreover, the performance comparisons are effected for a binary error rate (BER) of $10^{-5}$. The maximum number of iterations is fixed at 200.

Figure 6:
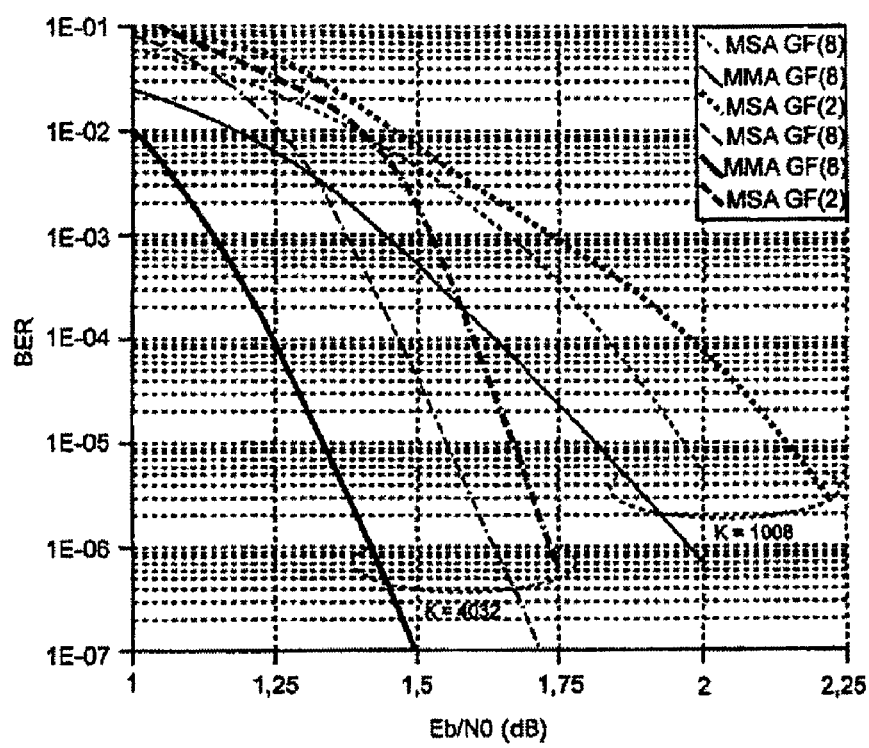
FIG. 6 represents a comparison of the performance obtained using the MSA decoder and that proposed by the invention for binary and non-binary LDPC codes.

FIG. 6 represents the performance of the MMA and MSA decoders with an LDPC code on GF(8) and of the MSA decoder with a binary LDPC code for codes having the following characteristics:

1008 information bits (i.e. 336 symbols), 2016 coded bits (i.e. 672 symbols) (i.e. a yield of ½), on the one hand;

4032 information bits (i.e. 1344 symbols), 8064 coded bits (i.e. 2688 symbols) (i.e. a yield of ½), on the one hand;

for the binary codes: $d_n^{ave}$=3.27;

for the codes on GF(8): $d_n^{ave}$=2.5.

Note that:

for the LDPC codes on GF(8), the MMA decoder is 0.15 to 0.22 dB better than the MSA decoder;

the code on GF(8) (MMA decoding) is 0.33 dB better than the binary code.

Note also that, following the simulations carried out (not represented), it has been found that for LDPC codes on GF(8) the MMA decoder is only 0.04 dB to the SPA decoder.

Figure 7:
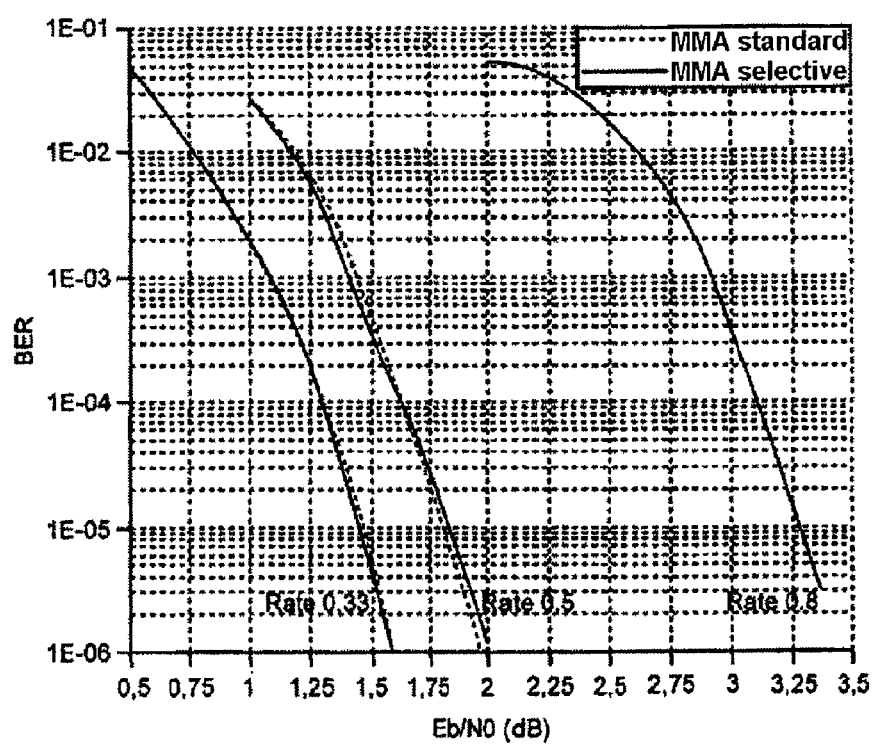
FIG. 7 represents a comparison of the performance obtained using the two embodiments described hereinafter.

The performance of the MMA decoder obtained using the "standard" and "selective" implementations are compared with reference to FIG. 7. LDPC codes on GF(8) are used of binary length equal to 2016 bits and of yield equal to ⅓, ½ and ⅘, with average degrees of the variable nodes of 2.4, 2.5 and 2.8, respectively. Moreover, the constants AI and COT used for the selective implementation have been fixed at:

AI=4.647, COT=10.

Note from FIG. 7 that the performance obtained is virtually identical in both cases, in other words there is no significant loss of performance of the selective implementation over the standard implementation.

Figure 8:
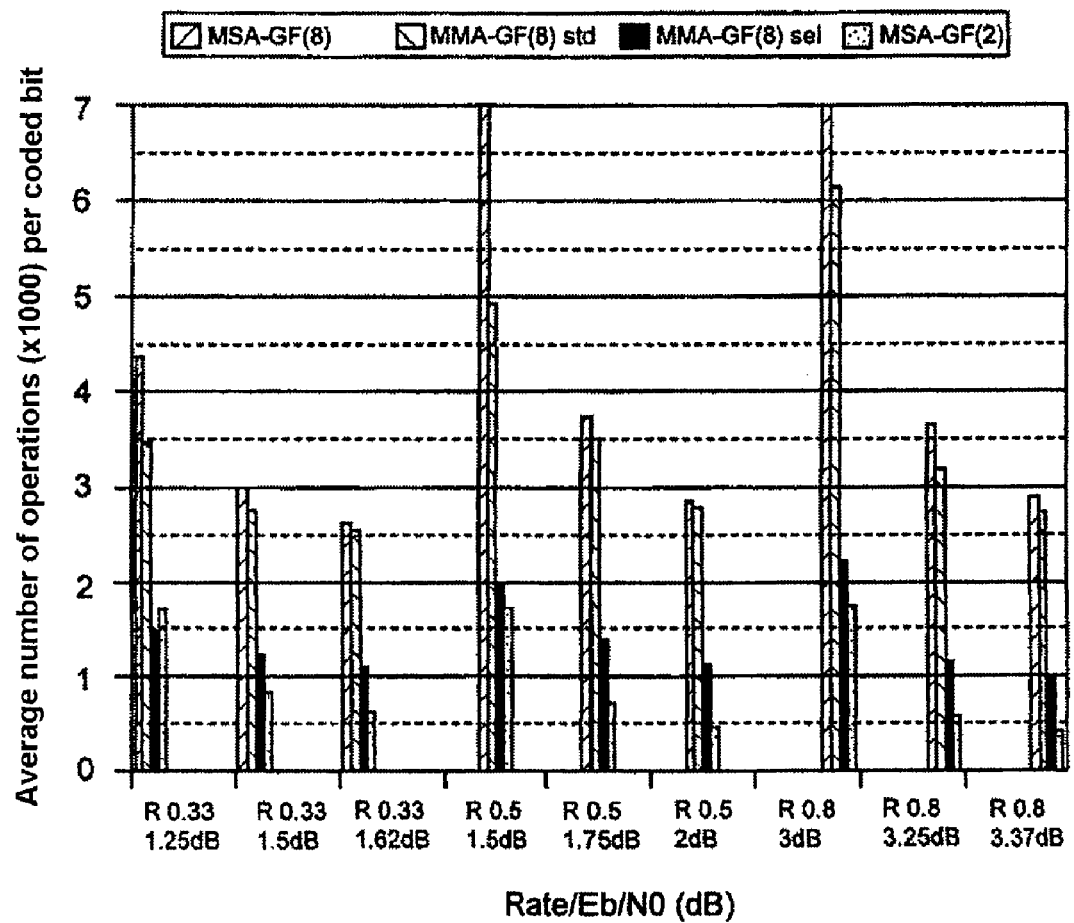
FIG. 8 represents a comparison of the complexities of MSA decoding and the decoding proposed by the invention for binary and non-binary codes.

FIG. 8 compares the complexity of MSA and MMA decoding (standard and selective implementations) on GF(8) and MSA decoding on GF(2) (binary code).

The number of operations represents the average number of operations in thousands per coded bit (cumulative for all iterations) effected by the two decoders. This number is dependent on the signal-to-noise ratio (SNR) as the average number of iterations effected by the two decoders decreases if the signal/noise ratio $E_b/N_0$ increases.

For each yield (⅓, ½ and ⅘) the average number of operations per coded bit has been recorded for the values of $E_b/N_0$ corresponding to the region in which the BER falls.

For GF(8), the MMA-standard decoder is less complex than the MSA decoder. This is because the MMA decoder converges faster than the MSA decoder; in other words, the number of iterations effected by the MMA decoder is less than the number of iterations effected by the MSA decoder (the two decoders effecting virtually the same number of operations per iteration).

For GF(8), the MMA-selective decoder is two to three times less complex than the MMA-standard decoder. The number of operations effected by the two decoders is the same but, for each iteration, the MMA-selective decoder effects fewer operations than the MMA-standard decoder.

Finally, it is seen that the MMA-selective decoder on GF(8) is only one to two times more complex than the binary MSA decoder.

The embodiments described above are merely possible embodiments of the invention, which is not limited to them.

APPENDIX

Two functions $f'$ and $f''$ are considered defined on GF(q) and with real values, and the function $f$ defined by the "min-max" formula:

$$f(a) = \min_{\substack{a',a'' \in GF(q) \\ a' \oplus a'' = a}} (\max(f'(a'), f''(a'')))$$

$\Delta'$ and $\Delta''$ are two sub-sets of GF(q) such that the set of values $\{f'(a')|a' \epsilon \Delta'\} \cup \{f''(a'')|a'' \epsilon \Delta''\}$ contains the q+1 lowest values from all the values of $f'$ and $f''$, i.e. from $\{f'(a')|a' \epsilon GF(q)\} \cup \{f''(a'')|a'' \epsilon GF(q)\}$.

It will be shown that $f(a)$ can then be calculated by the formula:

$$f(a) = \min_{\substack{a' \in \Delta', a'' \in \Delta'' \\ a' \oplus a'' = a}} (\max(f'(a'), f''(a'')))$$

which involves a reduced number of symbols a' and a''.

In a first step, it will be shown that any symbol $a \epsilon GF(q)$ can be written as the sum of two symbols:

$a=\delta'+\delta''$ with $\delta' \epsilon \Delta'$ and $\delta'' \epsilon \Delta''$.

For this there are defined two functions $I, T_a:GF(q) \rightarrow GF(q)$ by $I(x)=x$ (identity function) and $T_a(x)=a \oplus x$ (translation by a). Noting that the two functions are bijective, there is obtained:

$\text{card}(I(\Delta'))+\text{card}(T_a(\Delta''))=\text{card}(\Delta')+\text{card}(\Delta'') \geq q+1 > \text{card}(GF(q))$ It follows that there exist $\delta' \epsilon \Delta'$ and $\delta'' \epsilon \Delta''$ such that: $I(\delta')=T_a(\delta'')$, which is equivalent to $\delta'=a \oplus \delta''$, whence $a=\delta' \oplus \delta''$.

In a second step of the demonstration, $s',s'' \epsilon GF(q)$ denotes the two symbols such that $s' \oplus s''=a$, achieving the minimum in the definition of $f(a)$, in other words, such that:

$$\max(f'(s'), f''(s'')) = \min_{\substack{a',a'' \in GF(q) \\ a' \oplus a'' = a}} (\max(f'(a'), f''(a''))) = f(a)$$

$\delta' \epsilon \Delta'$ and $\delta'' \epsilon \Delta''$ are such that $a=\delta'+\delta''$ (after the first step). Remember that the symbols $\Delta'$ and $\Delta''$ correspond to the q+1 lowest values from the set of all values of the functions $f'$ and $f''$.

Then (by virtue of reductio ad absurdum reasoning) if we had $s' \notin \Delta'$ or $s'' \notin \Delta''$, at least one of the values $f'(s'), f''(s'')$ would be outside the q+1 lowest values and we would therefore obtain:

$\max(f'(\delta'), f''(\delta'')) < \max(f'(s'), f''(s''))$, which contradicts the minimal character of the pair s',s".
Thus we necessarily have s'∈Δ' and s"∈Δ" and consequently $$f(a) = \max(f'(s'), f''(s'')) = \min_{\substack{a'\Delta', a''\in\Delta'' \\ a'\oplus a''=a}} (\max(f'(a'), f''(a''))) \quad 5$$

The invention claimed is:

1. A method of iterative decoding of a received word, represented by values of a signal, according to a parity check matrix code, of the type using passage of messages between variable nodes and control nodes of a bipartite graph associated with the matrix, the method comprising at least one of the following steps:
   initializing at least one message from a variable node, as a function of the values, by information representing the ratio between the probability of having the most probable symbol at the position corresponding to the variable node and the probability of having the current symbol at the position;
   determining at least one message, relating to a particular symbol a, from a control node m to a particular variable node n, as the minimum value taken, among the sequences of symbols $a_k$ satisfying an equation $$\left(\bigoplus_{k=1}^{d} h_{m,n_k} \otimes a_k\right) \oplus (h_{m,n} \otimes a) = 0$$

where $h_{m,nk}$ is the element at line m and column $n_k$ of the parity matriz, $h_{m,n}$ is the element at line m and column n of the parity matrix and $n_k$ defines variable nodes, other than particular variable node n, by the maximal value of the messages received at the control node m from variable nodes $n_k$ other than the particular variable node n and each relating to the symbol $a_k$ associated with the other variable node in the sequence satisfying the equation; or
   determining the messages from a variable node to a control node which relate to all the symbols so that the minimal value of the messages is null.

2. The decoding method according to claim 1, wherein the step of initializing at least one message from a variable node comprises the following steps:
   for each symbol of the alphabet, determining the sum of the binary logarithmic likelihood ratios relating to the non-null bits of the symbol and to the position corresponding to the variable node;
   determining the minimum of the sums thus determined; and
   subtracting the minimum from each sum determined.

3. The decoding method according to claim 1 or 2, further comprising a step of determining a posteriori information relating to a variable node and to a symbol, like the sum of the initial message relating to the symbol at said variable node and all messages received at the variable node and relating to the symbol.

4. The decoding method according to claim 3, comprising the following steps:
   for each variable node, determining the symbol for which the a posteriori information is minimal; and
   if the sequence of the symbols determined in this way for all variable nodes is a code word, using the code word as estimated word.

5. The decoding method according to claim 1, wherein the step of determining the messages from a variable node to a control node comprises the following steps:
   for each symbol, determining the sum of the initial message relating to the symbol at the variable node and all the messages received at the variable node coming from a control node other than a given control node and relating to the symbol;
   determining the minimum of the sums thus determined; and
   for each symbol, subtracting the minimum from the sum thus determined relating to the symbol.

6. The decoding method according to claim 1, wherein the step of determining at least one message, relating to a particular symbol, from a control node to a particular variable node comprises the following steps:
   determining, for each symbol, an intermediate value equal to the minimal value taken by the maximal value of messages received at the control node from a portion only of the variable nodes associated with the control node; and
   determining the minimal value taken by the maximal value from intermediate values and messages received from a variable node associated with the control node and not belonging to said portion.

7. The decoding method according to claim 1, further comprising a step of determining the minimum, among the pairs of symbols belonging to the alphabet of the code, of the maximum of two values respectively associated with the two symbols of each pair, the step comprising the following sub-steps:
   determining sets each combining the symbols with which are associated values included in a particular range;
   selecting sets, among the sets determined, such that the reunion of the selected sets contains at least a predetermined number of symbols;
   using, as maximum of two values, the value associated with the symbol included in the set corresponding to the greater range when the values are associated with symbols included in selected sets corresponding to separate ranges; and
   determining if the values are associated with symbols included in selected sets corresponding to the same range by comparison of the maximum of two values.

8. The decoding method according to claim 1, wherein the code comprises a non-binary alphabet code.

9. A device for iterative decoding of a received word, represented by values of a signal, according to a parity check matrix code, of the type using passage of messages between variable nodes and control nodes of a bipartite graph associated with the matrix, the device comprising at least one of:
   means for initializing at least one message from a variable node, as a function of the values, by information representing the ratio between the probability of having the most probable symbol at the position corresponding to the variable node and the probability of having the current symbol at said position;
   means for determining at least one message, relating to a particular symbol a, from a control node m to a particular variable node n, as the minimum value taken, among the sequences of symbols $a_k$ satisfying an equation $$\left(\bigoplus_{k=1}^{d} h_{m,n_k} \otimes a_k\right) \oplus (h_{m,n} \otimes a) = 0$$

where $h_{m,nk}$ is the element at line m and column $n_k$ of the parity matriz, $h_{m,n}$ is the element at line m and column n of the parity matrix and $n_k$ defines variable nodes, other than particular variable node n, by the maximal value of the messages received at the control node m from variable nodes $n_k$ other than the particular variable node n and each relating to the symbol $a_k$ associated with the other variable node $n_k$ in the sequence satisfying the equation; or means for determining the messages from a variable node to a control node which relate to the set of symbols so that the minimal value of the messages is null.

10. A decoding device according to claim 9, wherein the means for initializing the message from a variable node comprises:

for each symbol of the alphabet, means for determining the sum of the binary logarithmic likelihood ratios relating to the non-null bits of the symbol and to the position corresponding to the variable node;

means for determining the minimum of the sums determined; and means for subtracting the minimum from each sum determined.

11. The decoding device according to claim 9 or 10, comprising means for determining a posteriori information relating to a variable node and to a symbol, like the sum of the initial message relating to the symbol at the variable node and all messages received at the variable node and relating to the symbol.

12. The decoding device according to claim 11, comprising:

for each variable node, means for determining the symbol for which the a posteriori information is minimal; and if the sequence is a code word, means for using the code word as an estimated word.

13. The decoding device according to claim 9, wherein the means for determining the messages from a variable node to a control node comprises:

for each symbol, means for determining the sum of the initial message relating to the symbol at the variable node and all messages received at the variable node coming from a control node other than the given control node and relating to the symbol;

means for determining the minimum of the sums thus determined; and for each symbol, means for subtracting the minimum from the sum thus determined relating to the symbol.

14. The decoding device according to claim 9, wherein the means for determining at least one message from a control node to a particular variable node comprises:

means for determining, for each symbol, an intermediate value equal to the minimal value taken by the maximal value of messages received at the control node from a portion only of the variable nodes associated with the control node; and means for determining the minimal value taken by the maximal value of the intermediate values and messages received from a variable node associated with the control node and not belonging to the portion.

15. The decoding device according to claim 9, further comprising means for determining the minimum, from the pairs of symbols belonging to the alphabet of the code, of the maximum of two values respectively associated with the two symbols of each pair, the means further comprising:

means for determining sets each combining the symbols with which are associated values included in a particular range;

means for selecting sets, among the sets thus determined, such that the reunion of the selected sets contains at least a predetermined number of symbols;

means for using, as maximum of two values, the value associated with the symbol included in the set corresponding to the greater range when the values are associated with symbols included in selected sets corresponding to separate ranges; and means for determining by comparison of the maximum of two values if the values are associated with symbols included in selected sets corresponding to the same range.

16. The decoding device according to claim 9, wherein the code comprises a non-binary alphabet code.

17. A communication apparatus comprising a device according to claim 9.

* * * * *